(12) United States Patent
Chan et al.

(10) Patent No.: US 8,441,885 B2
(45) Date of Patent: May 14, 2013

(54) METHODS AND APPARATUS FOR MEMORY WORD LINE DRIVER

(75) Inventors: Wei Min Chan, Sindian (TW); Li-Wen Wang, Taichung (TW); Jihi-Yu Lin, Taichung (TW); Chen-Lin Yang, Zhubei (TW); Shao-Yu Chou, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 104 days.

(21) Appl. No.: 13/051,681

(22) Filed: Mar. 18, 2011

(65) Prior Publication Data
US 2012/0236675 A1 Sep. 20, 2012

(51) Int. Cl.
*G11C 8/00* (2006.01)
(52) U.S. Cl.
USPC ............... 365/230.06; 365/230.01; 365/233.1
(58) Field of Classification Search ............... 327/96, 327/97, 105; 365/230.01 X, 230.06 O, 230.08, 365/233.1 X, 233.1, 230.01, 230.06
See application file for complete search history.

(56) References Cited

U.S. PATENT DOCUMENTS

| 5,737,270 | A  | * | 4/1998 | Oppold et al. ................. 365/203 |
| 6,172,531 | B1 | * | 1/2001 | Aipperspach et al. ......... 326/108 |
| 6,593,778 | B1 | * | 7/2003 | Bharathi ........................ 326/121 |
| 6,750,677 | B2 | * | 6/2004 | Sumita ............................ 326/94 |
| 7,800,407 | B1 | * | 9/2010 | Agarwal et al. ................. 326/80 |
| 7,940,580 | B2 | * | 5/2011 | Schreiber et al. ......... 365/189.11 |

\* cited by examiner

*Primary Examiner* — VanThu Nguyen
(74) *Attorney, Agent, or Firm* — Slater & Matsil, L.L.P.

(57) ABSTRACT

A word line driver circuit and corresponding methods are disclosed. An apparatus, comprising a decoder circuit coupled to receive address inputs, and having a decoder output; and a word line clock gating circuit coupled to the decoder output and to a word line clock signal, configured to selectively output a word line signal responsive to an edge on the word line clock signal; wherein the address inputs have a set up time requirement relative to the edge of the word line clock signal, and the address inputs have a zero or less hold time requirement relative to the edge of the word line clock signal. Methods for providing a word line signal from a word line driver are disclosed.

19 Claims, 6 Drawing Sheets

METHODS AND APPARATUS FOR MEMORY WORD LINE DRIVER

BACKGROUND

A common requirement for an advanced electronic circuit and particularly for circuits manufactured as integrated circuits ("ICs") in semiconductor processes are the use of memory for storage, and more recently, for discrete memory such as dynamic random access memory ("DRAM"), static random access memory ("SRAM") and non-volatile devices such as flash memory. In some highly integrated devices, embedded memory arrays are provided as part of an integrated circuit that may include additional functionality. So called systems on a chip "SoC" devices may provide a processor, program memory, data storage memory, and other functions needed to implement an entire solution. Single chip cellphones, PDAs, etc., are possible using SoC technology. These advanced integrated circuits require embedded memory formed as part of an integrated circuit that also includes other functions, such as radio transceivers, microprocessors, microcontrollers, processors, cell phone circuitry and the like. Recently, the embedded memory designs are provided as "cores" or "macros" that are included with other functionality on an integrated circuit such as an application specific integrated circuit ("ASIC").

Memory arrays may be formed with an array of memory cells arranged to place stored charge representing data onto one of or a pair of bit lines, or column lines, in response to a signal on an active row line, or word line. The timing of the memory cell access is therefore determined to a great extent by the duration of an active pulse on a word line.

The timing requirements of the memory array also affect the timing of the clock pulse and interface circuitry. In generating the word line signals to the memory array, address decoding circuitry is used. This address decoding circuitry receives a portion of a memory address into row decoders. The selected word line is determined from the row decoding logic circuitry after the address is presented. The address into the row decoders must be maintained for a period prior to the rising word line clock edge that will enable the word line drivers (set up time). In addition, the decoder outputs must be maintained at a steady value during the memory access, and remain steady for a period of time after the word line clock edge falls (hold time). These timing requirements place significant design constraints on the design of the overall integrated circuit.

The need for meeting these set up and hold time requirements typically results in the use of many latches in the interface circuits between the memory array and the remaining logic in the integrated circuit. These interface latches each require clocking and power and take up valuable silicon area. The timing requirements for the word line drivers thus create timing constraints which limit the design of the integrated circuit and place difficult constraints on the designer of new devices that include embedded memory arrays.

A continuing need thus exists for memory word line driver circuits and methods that overcome the disadvantages of the prior art approaches.

BRIEF DESCRIPTION OF THE FIGURES

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION

The making and using of the disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present application which are now described in detail provide novel methods and apparatus for a method and structure to provide a word line driver with negative hold time for a memory array. As a non-limiting, exemplary and illustrative example, an SRAM array will be described. However, the embodiments are applicable to any addressable memory array, irrespective of cell type, including, for example, static RAM, dynamic RAM, content addressable memory ("CAM"), graphics memory including serially accessed memory ("SAM"), and non-volatile memory. The embodiments are applicable to addressable memories of various sizes.

Figure 1:
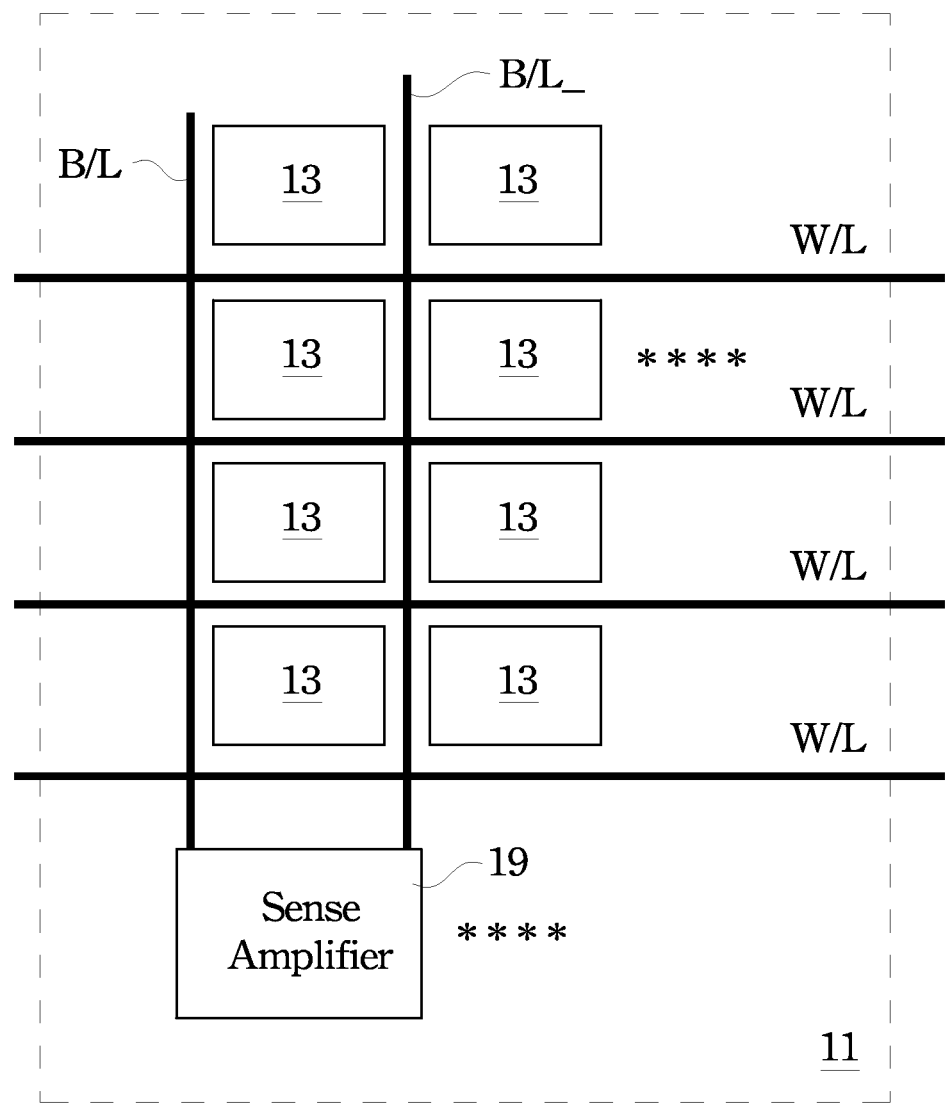
FIG. 1 depicts in a block diagram an array of memory cells for use with an embodiment.

FIG. 1 depicts in a simple block diagram an example application for application of the embodiments. Memory array 11 may be used as part of an integrated circuit that incorporates other functions, such as an application specific integrated circuit ("ASIC"), or it may be used as part of a dedicated SRAM integrated circuit device. Memory array 11 includes many memory cells 13, each of which stores a single datum or bit. The data stored will be described as a stored "0" or stored "1" corresponding to binary data. The voltage read from and written to the memory cells can be high or low, and either voltage may be arbitrarily assigned to either a logical "1" or logical "0" value. For convenience, a low voltage output is described here as representing a "0" logic level, but this logical correspondence may be modified without affecting the operation of the embodiments.

Memory cell array 11 also includes word lines W/L and complementary bit lines B/L and B/L_. The bit lines are true and complement bit line pairs and conduct the data to be stored into, and out of, the memory cells. The bit lines are typically arranged in columns and one pair of bit lines B/L and B/L_ corresponds to a single bit. The memory array may be of any convenient width, such as 8 bits, 16 bits, 32 bits, 64 bits, etc., and many sub-arrays are typically used. As an illustrative example, a 128K word SRAM may have 1 Million bits (that is 1 Mbit) if 8 bit words are used, or 4 Mbits if 32 bit words are used, for example. Many sub-arrays are typically used to form the SRAM array. Local and global bit lines are used to distribute the loading, and provide additional drive and fan out as needed.

Each pair of bit lines B/L and B/L_ is coupled to a sense amplifier 19. The sense amplifiers may use differential sensing to sense a small signal differential voltage, which may be as small as 100 millivolts, for example, to determine the voltage corresponding to the value stored in the SRAM cell. As is known to those skilled in the art, differential sensing provides very fast operation. The array of FIG. 1 is but one non-limiting example presented to illustrate the embodiments, which are applicable to many types of memory cells and arrays.

Figure 2:
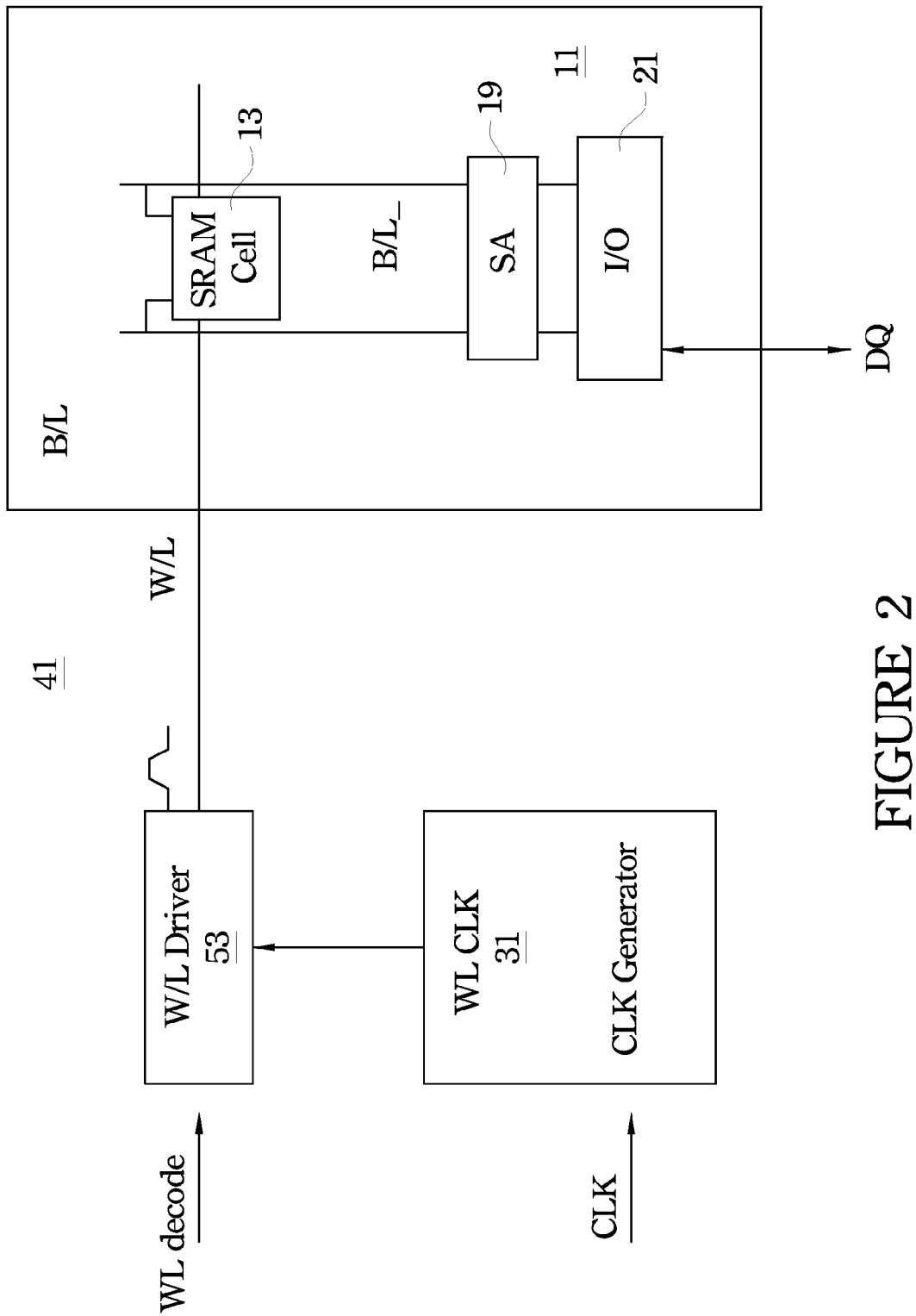
FIG. 2 depicts in an embodiment circuit diagram a memory array, a word line driver and a word line clock generator.

FIG. 2 depicts an embodiment memory array circuit 41 in a circuit block diagram. Memory array circuit 41 includes a clock generator circuit 31 that receives a clock input CLK, typically a clock used by an integrated circuit including the memory array circuit 41, and outputs a word line clock ("WL CLK") signal. A word line driver circuit 53 receives the WL CLK signal and a word line decode signal "WL decode". The word line driver circuit 53 then outputs the pulse on the word line "W/L". The high portion of the WL CLK signal will determine the length (or time duration) of the word line pulse W/L as further described below. The word line pulse signal W/L is then coupled to the selected SRAM cells 13 on the row of cells that are coupled to that particular word line. On arrival of the W/L pulse, these cells 13 begin placing data on the corresponding bit line pair of bit lines B/L and B/L_. Sense amplifier circuit 19 then senses the differential voltage on the bit lines and latches the signal and outputs a logical value; thus sensing and amplifying the differential voltage. The sense amplifiers are typically coupled to I/O circuits 21 which may include clocked latches or registers for providing the data DQ out of the memory array. In this manner the very small voltage output by the memory cells is amplified to a full logic level voltage, and synchronizes to the system clock, so that logic circuitry outside of the memory array can use the retrieved data.

Figure 3:
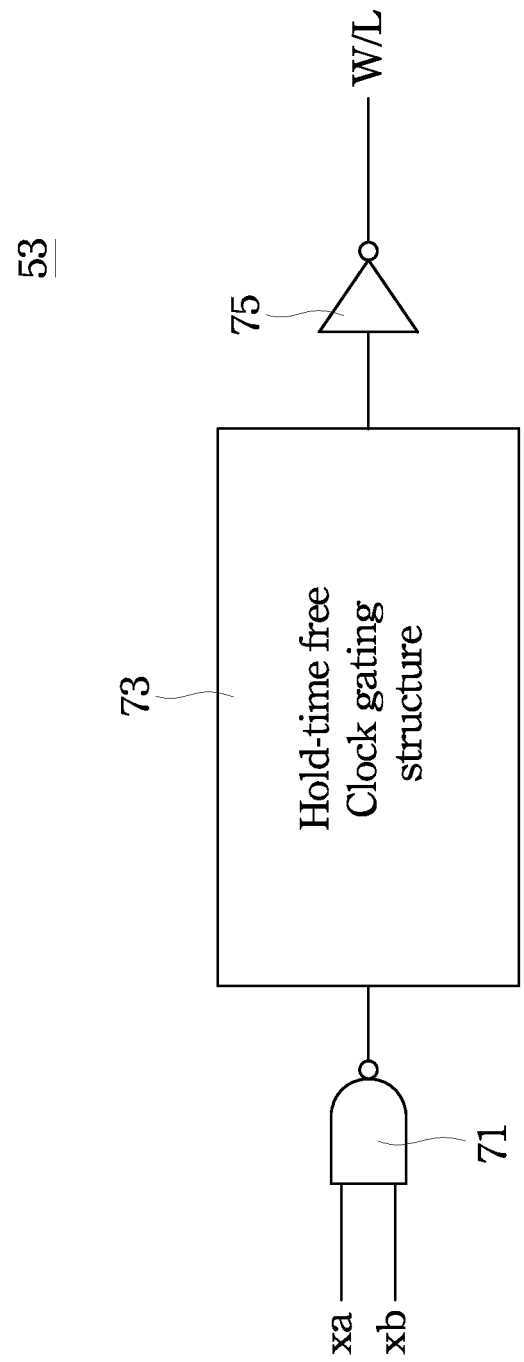
FIG. 3 depicts an embodiment word line driver in a block diagram.

FIG. 3 depicts in a simple block diagram an illustrative embodiment of the word line driver 53. In FIG. 3, a post decoder 71 receives the address signals xa, xb as inputs. A hold time free clock gating structure 73 receives the output of the post decoder. In this example embodiment, post-decoder 71 is a NAND gate. In alternative embodiments other post decoder circuits could be used, for example, an AND gate, NOR gate, OR gate or XOR gate. An output inverter 75 then drives the word line signal W/L. As will be further described below, in various embodiments, the internal circuitry of the hold time free clock gating structure 73 is arranged so that the timing requirements are only a set up time for the rising edge of a clock signal, there is no hold time required, thus greatly reducing the requirements on the circuitry providing the address inputs xa, xb.

Figure 4:
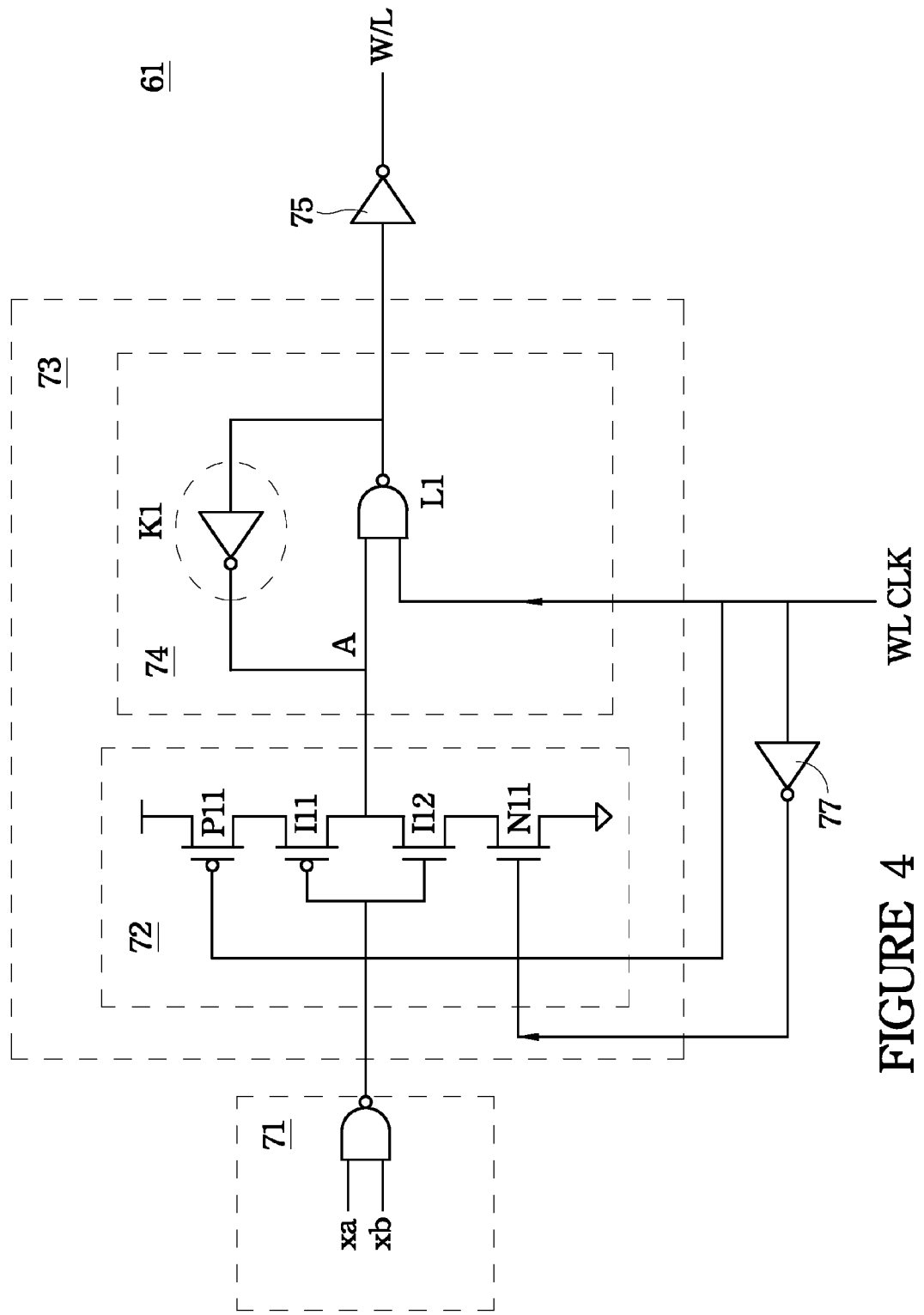
FIG. 4 depicts in a circuit diagram an embodiment word line driver.

FIG. 4 depicts in one embodiment a circuit implementation of the hold time free clock gating structure 73 for the word line driver 53. In FIG. 4, the NAND gate 71 is coupled to a latch input circuit 72 formed of a CMOS inverter (although other arrangements could be used) comprising PMOS transistor I11 and NMOS transistor I12 and a clock gating circuit of PMOS transistor P11 and NMOS transistor N11. The internal node A receives the output of the latch input circuit 72. A latch 74 formed of the logic gate L1 and the keeper inverter K1 receives the voltage at node A. The output of the latch 74 is then input to inverter 75 which drives the word line output W/L.

In operation, the input latch circuit 72 receives the output of NAND gate 71 when the WL CLK signal is at a low level. PMOS transistor P11 is active when a low voltage (WL CLK) is at its gate terminal, and NMOS transistor N11 is active when the WL CLK signal is low and it receives the output of inverter 77, which is now high, at its gate. The PMOS transistor P11 supplies a Vdd voltage to the inverters I11 and I12, and the NMOS transistor N11 supplies the inverters I11 and I12 a low voltage or ground signal. The node A then receives the output of NAND gate 71, inverted by the PMOS transistor I11 and NMOS transistor I12 which form a CMOS inverter, Thus node A receives the AND function of signals xa, xb, If both xa and xb are a "1" when the WL CLK signal is low, then the output of the NAND gate 71 is a "0". The gate to the PMOS transistor I11 and the NMOS transistor I12 will be a low voltage, so PMOS transistor I11 will be active, and the voltage node A will be high, or a "1". On the other hand, if either input xa, or xb, are a "0", then the output of the NAND gate 71 is a "1". In this case, the NMOS transistor I12 will be active, and PMOS transistor I11 will be inactive, and the voltage at node A will be a low voltage, or "0". When the WL CLK is at a low voltage, then, node A is logically equal to the AND of input signals xa, xb.

Now, when the WL CLK signal rising edge occurs, the gate of the PMOS transistor P11 goes high as it is coupled to WL CLK. The gate of NMOS transistor N11 goes low, as it is coupled to the output of the inverter 77. The latch input circuit 72 then closes, and the signals xa, xb no longer affect node A. The voltage at node A is then held by the operation of the latch 24, which includes a logic gate L1 (a NAND gate in this embodiment, but other logic gates may be used) and the keeper inverter K1. Logic gate L1 is enabled when the WL CLK signal goes high, and because it is high, the output of logic gate L1, which is a NAND gate, is the inverse of the voltage at node A. The keeper inverter K1 then reinforces this voltage in a feedback loop and while the WL CLK signal is at a high voltage, this latch 72 holds the voltage at node A. The inverter 75 drives the word line W/L and inverts the output of logic gate L1, so that the voltage on the word line W/L is the same as at node A.

The timing of the operations of the word line driver circuit 73 is determined by the rising edge of the WL CLK signal. The inputs xa, xb have a set up time requirement with respect to the rising edge of the WL CLK signal. After the WL CLK signal rises, node A is no longer affected by signals xa, xb and so the signals xa, xb may change without affecting the voltage on the word line W/L. The latch 74 is enabled by the high portion of the WL CLK signal, so that the word line W/L is only enabled during the high portion.

Very shortly after the word line clock signal WL CLK rises, the signals xa, xb no longer affect node A or the word line signal W/L. There is a very short hold time constraint with respect to the rising edge of the signal WL CLK. There is no timing constraint with respect to the falling edge of the signal WL CLK on the address signals xa, xb. The lack of a timing constraint with respect to the falling edge of the WL CLK means the external circuits (not shown) driving the signals xa, xb may vary these signals throughout the period when WL CLK is high, and so long as the set up time to the rising edge of the WL CLK signal is met, for a good portion of the WL CLK low phase as well. Thus the timing constraints are greatly reduced on the circuitry. Because the NAND gate 71 provides a delay that is very likely to be longer than any hold time required after the word line clock WL CLK rises, the word line driver circuit 73 is hold time free with respect to the input signals xa, xb. Once the rising edge of WL CLK arrives, there are no more timing constraints on the input signals. The word line clock driver circuit 73 is therefore "hold time free" with respect to both the rising and falling edge of WL CLK.

Figure 5:
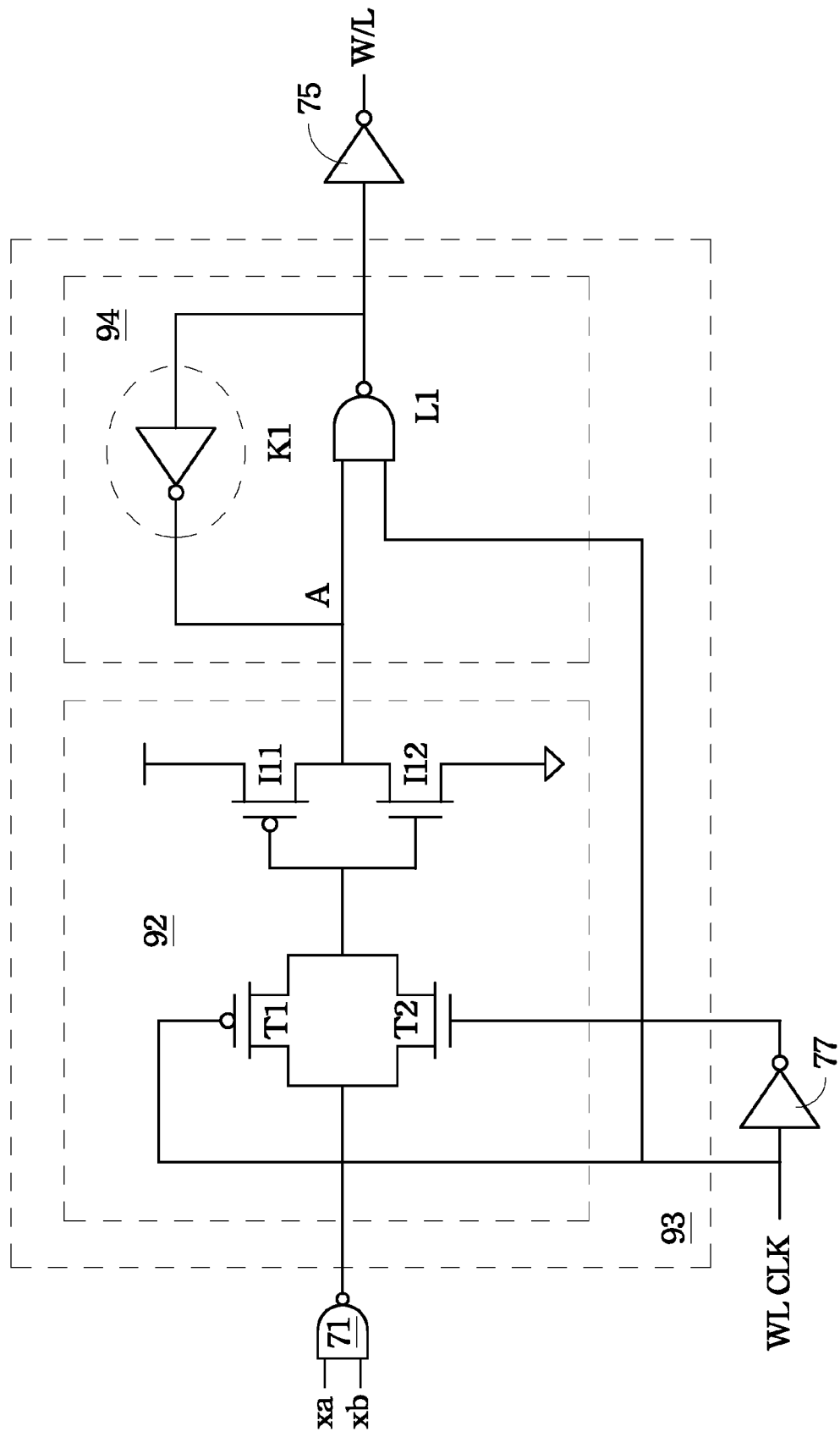
FIG. 5 depicts in a circuit diagram an alternative embodiment word line driver.

FIG. 5 depicts another hold time free clock gating structure 93 which is an alternative embodiment implementation. In FIG. 5, a latch input circuit 92 is formed by the pass gates T1, T2 which will pass the output of the NAND gate 71 to the input of the inverter of transistors I11, I12 during the low portion of signal WL CLK. When the clock signal transitions to a high phase, the pass gates are disabled. PMOS transistor I11 and NMOS transistor I12 form a CMOS inverter which couples the output of the pass gates T1, T2 to node A. Node A is then latched by the latch circuit 94, which includes logic gate L1 and conditional keeper K1, just as in FIG. 4. In this alterative embodiment, the output of the logic gate L1 is again a signal gated by the high phase of the signal WL CLK. The inverter 75 then drives the word line output W/L as before. While the implementations of FIGS. 4 and 5 differ, the functional operations of the hold time free clock gating structures 73 shown in FIGS. 4, and 93 shown in FIG. 5, are equivalent.

Figure 6:
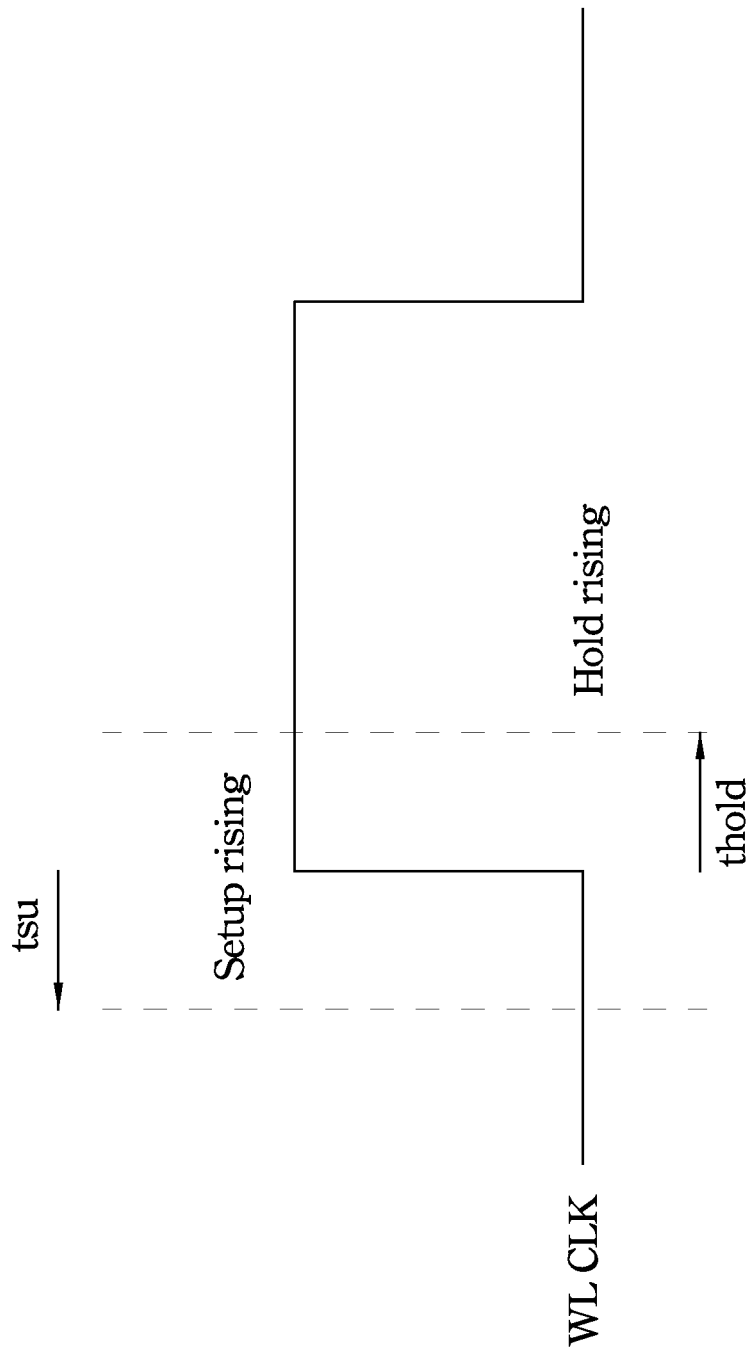
FIG. 6 depicts in a timing diagram the set up and hold time requirements for the word line driver embodiments.

FIG. 6 illustrates in a timing diagram the rising edge timing requirements for the outputs of the decoder NAND gates 71 to the hold time free clock gating structures 73, or 93, of FIGS. 4 and 5. In FIG. 6, there is a set time requirement "tsu" relative to the rising edge of the signal WL CLK. The signals input to the latch input circuits (the outputs of the NAND gate 71 in either FIG. 4, or 5) must be stable for a short time prior to the arrival of the rising edge of the signal WL CLK. Also, the inputs to the latch circuits 73, or 93, must remain stable for a short time after the arrival of the rising edge of the signal WL CLK. In FIG. 6, this appears as a hold time (rising) requirement "thold". However, after that short hold time elapses there is no further timing requirement on the input signals, as the latches of FIG. 4 or 5 will maintain the value at the internal node A in the word line driver circuit embodiments during the active portion of the word line clock signal WL CLK. Signals xa, xb in FIGS. 4 and 5 can then change without affecting the word line signal W/L. Thus, the timing constraints on the remaining circuitry are substantially relaxed when compared to prior approaches. The use of the word line driver embodiments eliminates the need for many input latches at the interface between the memory and the address signals, control signals, etc.

Further, it is noted in FIG. 6 that the hold time (rising) is very short. The delay that naturally occurs in the decoder NAND gates 71 may be sufficient to provide a delay as long as, or longer than, the hold time (rising). The hold time with respect to the signals xa, xb in FIGS. 4 and 5 can then be zero or even negative. The embodiment word line driver circuits are therefore hold time free with respect to the input signals xa, xb, which are memory address signals that are decoded to select the active word line.

In an embodiment, an apparatus comprises: a word line decoder receiving address decode signals and outputting a word line decoder signal; a word line clock gating structure coupled to the word line decoder signal and receiving a word line clock signal, configured to output a word line signal for an active phase of the word line clock signal, responsive to the word line decoder signal; wherein the address decode signals have a set up time requirement relative to the rising edge of the word line clock signal, and a zero or less hold time requirement relative to the rising edge of the word line clock signal.

In another embodiment, an apparatus comprises a decoder circuit coupled to receive address inputs, and having a decoder output; and a word line clock gating circuit coupled to the decoder output and to a word line clock signal, configured to selectively output a word line signal responsive to an edge on the word line clock signal; wherein the address inputs have a set up time requirement relative to the edge of the word line clock signal, and the address inputs have a zero or less hold time requirement relative to the edge of the word line clock signal.

In another embodiment, a method comprises providing a word line decoder circuit coupled to address signals and outputting a decoder output; and coupling a word line clock gating circuit to the decoder output and to a word line clock signal, configured to output a word line pulse on a word line signal responsive to a an edge on the word line clock signal; wherein the address signals have a set up time requirement relative to the edge of the word line clock signal, and a zero or less hold time requirement relative to the edge of the word line clock signal.

Moreover, the scope of the present application is not intended to be limited to the particular embodiments of the structures, methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. An apparatus, comprising:
    a word line decoder receiving address decode signals and outputting a word line decoder signal;
    a word line clock gating structure coupled to an internal node and receiving a word line clock signal having an active phase and an inactive phase for each period of the word line clock signal, configured to output a word line signal during the active phase of the word line clock signal, responsive to the word line decoder signal; and
    latch input circuitry coupled between the word line decoder signal and the word line clock gating structure, configured to output the word line decoder signal to the internal node during an inactive phase of the word line clock signal;
    wherein the address decode signals have a set up time requirement relative to the rising edge of the word line clock signal that begins the active phase of the word line clock signal, and a zero or less hold time requirement relative to the rising edge of the word line clock signal.

2. The apparatus of claim 1, wherein the word line clock gating structure further comprises:
    a latch configured to hold the output of the word line decoder at the internal node during the active phase of the word line clock signal.

3. The apparatus of claim 1, wherein the latch input circuitry further comprises an inverter coupled to receive the word line decoder signal and a clock gating circuit operable to enable the inverter during the first portion of the word line clock signal.

4. The apparatus of claim 3, wherein the latch further comprises a logic gate coupled to receive the signal at the internal node and to receive the word line clock signal, configured to enable a latch input during inactive phase of the word line clock signal, and a conditional keeper coupled in a feedback fashion to the output of the logic gate and maintaining the internal node at the input of the logic gate when the latch input circuitry is disabled.

5. The apparatus of claim 4, wherein the logic gate comprises a NAND gate and further comprising an inverter coupled to the output of the NAND gate providing a word line output.

6. The apparatus of claim 1, wherein the latch input circuitry further comprises an inverter having an input coupled to a pair of pass gates coupled to true and complementary forms of the word line clock signal, the pass gates coupling the input of the inverter to the word line decoder signal responsive to the inactive phase of the word line clock signal, and an internal node at the output of the inverter.

7. The apparatus of claim 6, wherein the latch further comprises a logic gate coupled to receive the internal node and to the word line clock signal, to enable a latch during a second portion of a word line clock cycle, and a conditional keeper coupled in a feedback fashion to the output of the logic gate configured to maintain the value of the internal node at the input of the logic gate when the latch input circuitry is disabled.

8. The apparatus of claim 1, wherein the hold time for the inputs to the word line decoder relative to the rising edge of the word line clock signal is a negative hold time.

9. An apparatus, comprising:
  a decoder circuit coupled to receive address inputs, and having a decoder output; and
  a word line clock gating circuit coupled to the decoder output and to a word line clock signal that has a first portion and a second portion in each period, configured to selectively output a word line signal during one of the first and second portions of each period of the word line clock signal responsive to an edge stating one of the first portion and the second portion on the word line clock signal, and further comprising a latch input circuit coupled to the decoder output and to the word line clock signal and inputting the decoder output to an internal node responsive to first portion of the word line clock signal;
  wherein the address inputs have a set up time requirement relative to the edge of the word line clock signal, and the address inputs have a zero or less hold time requirement relative to the edge of the word line clock signal.

10. The apparatus of claim 9, wherein the word line clock gating circuit further comprises:
  a latch configured to hold the output of the word line decoder at the voltage at the internal node responsive to a second portion of the word line clock signal.

11. The apparatus of claim 10, wherein the latch input circuit further comprises a logic gate coupled to receive the signal at the internal node and to receive the word line clock signal, configured to enable the latch during the second portion of the word line clock signal, and a conditional keeper coupled in a feedback fashion to the output of the logic gate and maintaining the internal node at the input of the logic gate during the second portion of the word line clock signal.

12. The apparatus of claim 10, and further comprising an output inverter coupled to the output of the latch input circuit and driving a word line signal.

13. The apparatus of claim 10, wherein the latch input circuit further comprises an inverter coupled to receive the word line decoder output and a clock gating circuit operable to enable the inverter during a first portion of the word line clock signal.

14. The apparatus of claim 13, wherein the edge of the word line clock signal is a rising edge, and the first portion of the word line clock signal is an active low portion.

15. The apparatus of claim 10, wherein the latch input circuit further comprises a pass gate coupled to receive the word line decoder output and to output the word line decoder output responsive to the first portion of the word line clock signal, and a CMOS inverter coupled to invert the output of the pass gate and having an output coupled to the internal node.

16. The apparatus of claim 15, wherein the edge of the word line clock signal is a rising edge, and the first portion of the word line clock signal is an active low portion.

17. A method, comprising:
  providing a word line decoder circuit coupled to address signals and outputting a decoder output; and
  coupling a word line clock gating circuit to the decoder output and to a word line clock signal having a first portion and a second portion, configured to output a word line pulse on a word line during each period of the word line clock signal responsive to an edge on the word line clock signal;
  wherein coupling the word line clock gating circuit further comprises coupling a latch input circuit to the decoder output and to the word line clock signal, and inputting the decoder output signal into an internal node responsive to a first portion of the word line clock signal, and wherein the address signals have a set up time requirement relative to the edge of the word line clock signal, and a zero or less hold time requirement relative to the edge of the word line clock signal.

18. The method of claim 17, and further comprising latching the voltage at the internal node in a latch circuit responsive to the edge of the word line clock signal; and maintaining the voltage at the internal node responsive to a second portion of the word line clock signal.

19. The method of claim 17, and further comprising operating the word line clock gating circuit to latch the decoder output on a rising edge of the word line clock signal, the first portion of the word line clock signal being an active low portion, the second portion of the word line clock signal being an active high portion, and wherein a hold time constraint on the address signals is a negative hold time with respect to the rising edge of the word line clock signal.

* * * * *